BEST AVAILABLE COPY

United States Patent [19] [11] 3,895,238
Saari [45] July 15, 1975

[54] DRIVER CIRCUIT FOR HIGH SPEED GATING OF A FIELD EFFECT TRANSISTOR

[75] Inventor: Veikko Reynold Saari, Spring Lake Heights, N.J.

[73] Assignee: Bell Telephone Laboratories, Incorporated, Murray Hill, N.J.

[22] Filed: Feb. 25, 1974

[21] Appl. No.: 445,492

[52] U.S. Cl. ................. 307/255; 307/270; 307/251
[51] Int. Cl.[2] ......................................... H03K 17/00
[58] Field of Search ............ 307/254, 270, 255, 251

[56] References Cited

UNITED STATES PATENTS 3,531,660 9/1970 Engberg ............................. 307/270
3,751,682 8/1973 Howe ............................. 307/255 X

*Primary Examiner*—Michael J. Lynch
*Assistant Examiner*—B. P. Davis
*Attorney, Agent, or Firm*—G. E. Murphy; W. Ryan

[57] ABSTRACT

A driver circuit for gating either insulated gate field effect or junction type field effect transistors is disclosed. The circuit utilizes separate circuit paths to rapidly switch a driven field effect transistor into conducting, ON, and nonconducting, OFF, states, and exhibits a high output impedance during the ON state of the driven transistor to protect the driven transistor from excess gate current and a low output impedance during the OFF state of the driven transistor to provide maximum noise immunity.

10 Claims, 3 Drawing Figures

PATENTED JUL 15 1975 3,895,238

SHEET 1

DRIVER CIRCUIT FOR HIGH SPEED GATING OF A FIELD EFFECT TRANSISTOR

BACKGROUND OF THE INVENTION

1. Field of the Invention

This invention pertains to switching circuitry, and more particularly to circuitry which may be employed to drive or gate a field effect transistor.

The field effect transistor (FET) has found wide acceptance as a signal switching device. Both the insulated gate FET (IGFET) and the junction FET (JFET) exhibit a relatively high drain-to-source conductance ON state and a relatively low drain-to-source conductance OFF state in response to proper drive signals applied to the FET gate electrode. Advantageously, either type FET offers solid state reliability and miniaturization, thus providing a desirable alternative to prior art mechanical switches and relays. Moreover, both types of FETs generally require less power to activate than prior art bipolar transistor switches.

In applications, such as the switching of analog signals, the JFET is often somewhat preferred over the IGFET because of the JFET's lower ON state drain-to-source resistance and the fact that during the ON state the JFET channel resistance is not modulated by the switched analog signal. However, the JFET gate electrode, unlike that of the IGFET, is not electrically isolated from the source-and-drain electrodes and the JFET must therefore be protected from excessive forward current flow through the gate junction.

2. Description of the Prior Art

Numerous circuits have been used to drive FET switches. Some of these circuits have been designed to gate both JFETs and IGFETs, while some circuits have been developed to specifically drive a JFET or specifically drive an IGFET. Various criteria have guided the design of such circuits including switching speed, power consumption, suppression of switching transients, protection of the JFET gate junction, noise margin, economy, miniaturization, and circuit simplicity.

The prior art, however, does not apparently include a driver circuit which simultaneously realizes all of the above-mentioned design criteria. For example, simultaneously providing protection for the JFET gate junction and superior noise margin has generally been thought of as being subject to conflicting design considerations. Usually, the prior art either compromised these important circuit parameters, or, more commonly, manufacturers of silicon integrated driver circuits required those employing the circuit device to provide additional circuitry. Neither of these steps has proven satisfactory, especially in the case of large systems which employ many JFETs and associated driver circuits which must function in an electrically "noisy" environment. In such an application, protection of the JFET gate circuit is necessary to ensure adequate system reliability and life, whereas an adequate noise margin or noise immunity must be provided to ensure that a JFET is not inadvertently switched to the ON state by a system transient or other spurious signal.

It is therefore an object of this invention to economically realize a FET gating circuit which substantially complies with all of the above-identified criteria, particularly providing current protection of a driver JFET's gate junction while also providing superior noise margin.

It is another object of this invention to provide a FET gating circuit which is readily realized as a monolithic silicon integrated circuit.

Further, it is an object of this invention to realize a gating circuit, which is capable of driving either IGFET or JFET switches, and which is particularly suited for driving JFET switches by the provision of a high impedance output to maintain current limiting during the JFET ON state and low output impedance to provide superior noise margin during the JFET OFF state.

SUMMARY OF THE INVENTION

In accordance with the principles of this invention, the driver circuit of this invention utilizes two separate circuit paths, one which will rapidly drive a FET into a conducting state, and one which will rapidly restore the FET to a nonconducting state. Each circuit path is responsive to a voltage transition in the input signal, one path responding to a negative voltage transition, and the other to a positive transition. Thus, ON-OFF FET switching may be effected by a rectangular pulse applied to the driver circuit input, and repetitive switching or sampling may be effected by the use of a rectangular pulse train or square wave command or input signal. In addition, interaction between the two separate circuit paths enhances the circuit operation by establishing conditions in the unoperated circuit path which are conductive to rapid switching action when the command signal changes voltage level.

DETAILED DESCRIPTION

Figure 1:
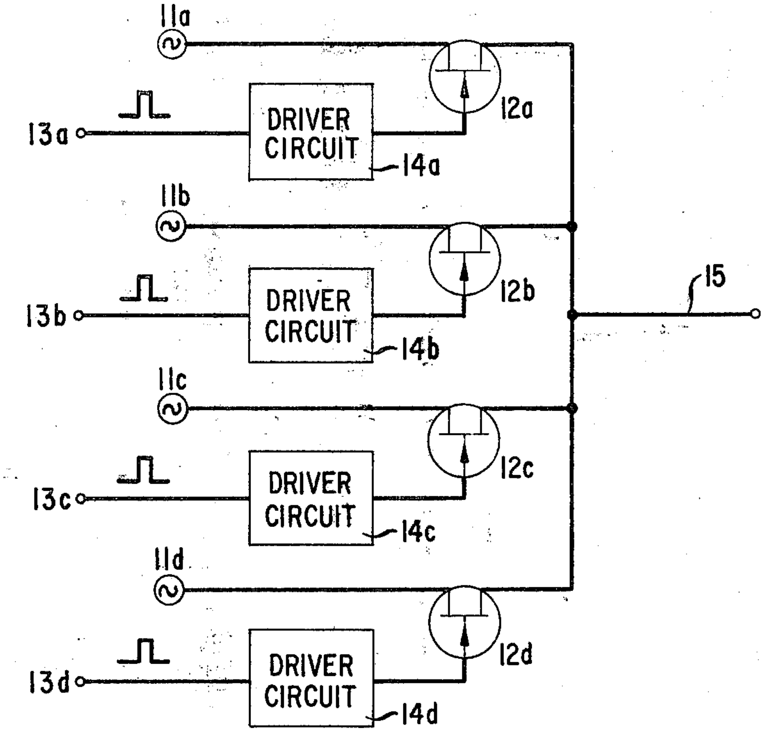
FIG. 1 is a block diagram representation of an analog switching system which demonstrates one use of the present invention.

FIG. 1 schematically illustrates an analog data sampling system of a kind which may usefully employ this invention. Such systems are commonly employed in time mutliplexed communications systems. In FIG. 1, a plurality of analog data sources 11*a*, 11*b*, 11*c*, and 11*d*, for example, are time multiplexed onto a common output line 15 by the sequential conduction of a plurality of N channel JFETs, 12*a*, 12*b*, 12*c*, and 12*d*. As shown in FIG. 1, JFETs 12*a*, 12*b*, 12*c*, and 12*d* are typically parallel connected to output line 15 and serially connected to separate analog data sources 11*a*, 11*b*, 11*c*, and 11*d*. These parallel JFET switchs are controlled by gate driver circuits 14*a*, 14*b*, 14*c*, and 14*d* which respond to appropriate input or command signals applied to terminals 13*a*, 13*b*, 13*c*, and 13*d*. In operation, the system depicted in FIG. 1 may have a multitude of channels, and the present invention is advantageously employed for each of the depicted gate driver circuits 14. It is to be understood, however, that FIG. 1 merely depicts one application of this invention and that the circuits of FIGS. 2 and 3 are generally applicable as driver circuits whenever the device to be driven exhibits characteristics similar to those of a field effect transistor.

Figure 2:
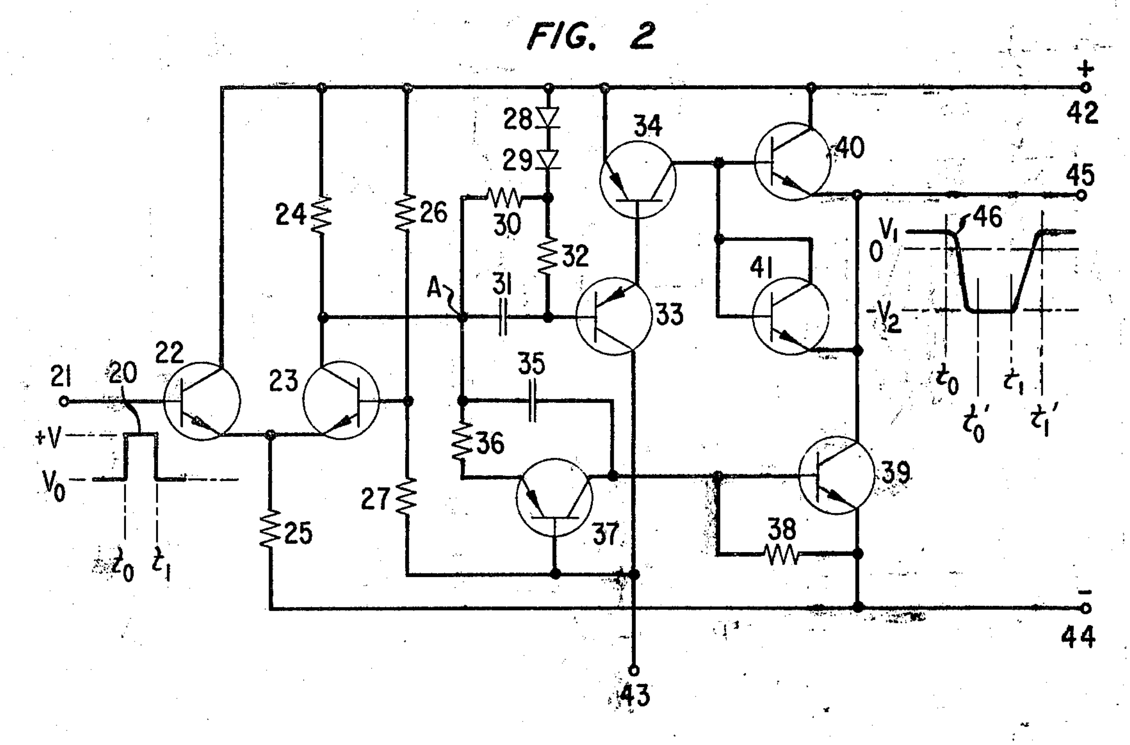
FIG. 2 is a schematic drawing of a driver circuit in accordance with this invention.
Figure 3:
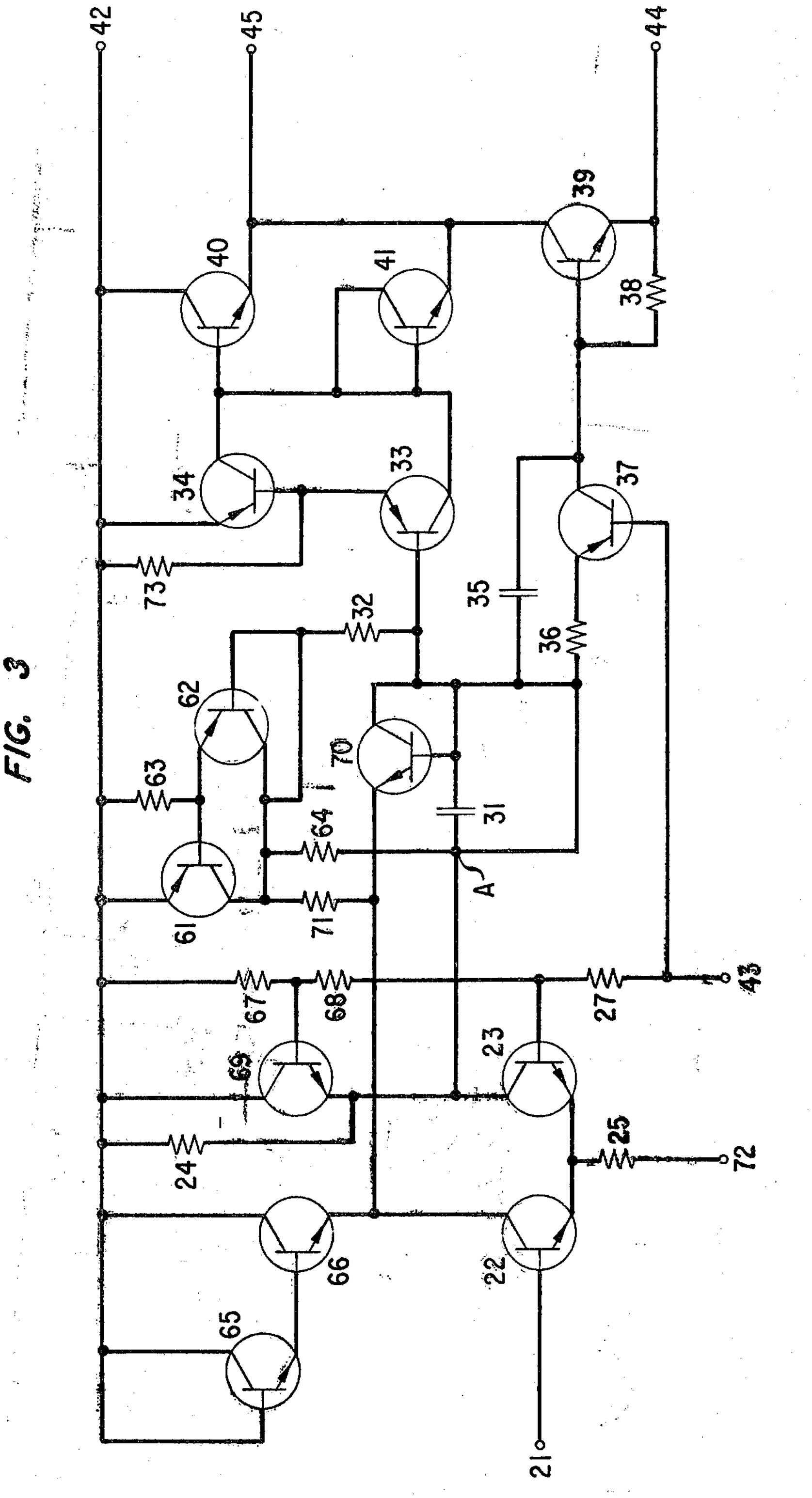
FIG. 3 is a schematic circuit diagram depicting a monolithic silicon integrated circuit embodiment in accordance with this invention.

FIG. 2 depicts a driver or gating circuit in accordance with this invention. In FIG. 2, transistor 39 is connected in cascade with transistor 40, the collector of transistor 40 being connected to bias terminal 42, and the emitter of transistor 39 being connected to bias terminal 44, the junction of the emitter of transistor 40 and the collector of transistor 39 being commonly connected to output terminal 45. Diode-connected transistor 41, connected between the base and emitter terminals of transistor 40, is poled such that the effective anode is connected to the base electrode of transistor 40. Although a conventional diode may be utilized in place of transistor 41, it is advantageous to employ a transistor of the same construction as transistor 40. The use of a transistor identical to transistor 40 ensures that the current which flows through diode-connected transistor 41 is substantially equal to the current which flows through the emitter of transistor 40, thereby establishing the current gain of the signal path comprising transistor 40 and diode-connected transistor 41 substantially equal to a factor of two. As will be recognized upon further understanding the circuit operation, this gain control aids in limiting the amount of forward current which can flow into the gate electrode of a driven JFET which may be advantageously connected to output terminal 45.

Input terminal 21 is connected to the base of transistor 22, which is differentially connected to transistor 23. Transistors 22 and 23, in conjunction with resistors 24, 25, 26, and 27, comprise a conventional differential amplifier stage which is operated in a single-ended mode and provides signal gain and the necessary input impedance.

It is readily observed that circuit node A, connected to the output of the differential stage, is also connected to output terminal 45 by two circuit paths. One path, comprising transistors 37 and 39, resistors 36 and 38, and capacitor 35, is responsive to a positive-going voltage transition of command or input signal 20 and produces the negative-most output signal potential, $-V_2$, at output terminal 45. Specifically, this path in FIG. 2 is formed by capacitor 35, which is connected in parallel with a circuit branch consisting of resistor 36 seriesconnected with the collector-emitter path of transistor 37 such that the emitter of transistor 37 is connected to one terminal of resistor 36. The capacitor 35-resistor 36 junction of this parallel combination is connected to circuit node A and the collector-capacitor 35 junction is connected to the base electrode of transistor 39. Resistor 36 is connected between the base electrode of transistor 39 and bias terminal 44. The base electrode of transistor 37 is connected to bias terminal 43.

The second signal path which connects circuit node A with output terminal 45 includes diodes 28 and 29, which may be suitably connected transistors, resistors 30 and 32, capacitor 31, transistors 33 and 34, diode-connected transistor 41, and transistor 40. This path is responsive to a negative-going transition in command signal 20 and produces the positive-most output signal potential, $V_1$, at output terminal 45. As shown in FIG. 2, capacitor 31 connects circuit node A to the base of transistor 33. Diodes 28 and 29 are serially connected with resistor 32 between bias terminal 42 and the base of transistor 33. these components, in conjunction with resistor 30, which is connected between the junction of resistor 32-diode 29 and circuit node A, provide bias for transistors 33 and 34 during that part of the negative portion of command signal 20 in which capacitor 31 is essentially fully charged. The collector electrode of transistor 33 is connected to bias terminal 43 and the emitter is connected to the base of transistor 34. The emitter of transistor 34 is connected to bias terminal 42 and the collector of transistor 34 is connected to the base electrode of transistor 40.

In utilizing the circuit of FIG. 2 to drive, e.g., an N channel JFET, as depicted in FIG. 1, the positive-most driver output signal must be controlled to protect the driven JFET from excessive forward current flow in the FET gate-source circuit. This protection, in accordance with this invention, is accomplished by controlling the maximum collector current of transistor 34, thereby controlling the maximum positive output current. In one application, it was found advantageous to establish the maximum collector current of transistor 34 at 50 microamperes, thereby establishing the maximum output current at one hundred microamperes. It will be recognized by those skilled in the art that the most advantageous current level is determined by the particular JFET used, and by system requirements. It will also be recognized that a current limited driver circuit is an important asset which prevents large destructive forward currents from flowing through the gate junction of a driven JFET while simultaneously allowing attainment of the lowest possible JFET ON resistance. Thus, in effect, the present invention provides a high impedance output—or current limiting action—during that portion of the switching cycle in which a driven JFET is in the ON state.

When the circuit of FIG. 2 is utilized in driving an N channel JFET as shown in FIG. 1, the negative-most output signal is necessarily a negative voltage whose magnitude exceeds the JFET pinch-off voltage by at least the maximum peak magnitude of the switched analog data signal. In the subject circuit, the magnitude of the negative-most output signal is controlled by the bias potential applied to terminal 44 and the saturation characteristics of transistor 39. Regardless of the potential established, it can be seen that the circuit output impedance during this portion of the switching cycle is relatively low, being primarily determined by the saturation resistance of transistor 39. Thus, the present invention advantageously provides a low output impedance during the driven JFET OFF period, thereby establishing excellent noise margin or immunity from false operation due to spurious signals which may be inadvertently coupled to the JFET gate circuit.

In operation, command signal 20, a low voltage control pulse, is applied to input terminal 21. The positive-going transition of command signal 20 at time $t_o$ increases the voltage drop across resistor 25, thereby decreasing the current through transistor 23 and causing the voltage at circuit node A to increase. This rise in potential causes current to flow through capacitor 35 into the base electrode of transistor 39. Simultaneously, the rise in potential causes transistors 33 and 34 to be cut off, since any charge previously stored in capacitor 31 will flow through resistors 30 and 32. The increased base current of transistor 39 causes it to become slightly saturated, which, in turn, causes the potential at output terminal 45 to approach the negative fixed bias potential applied to terminal 44. Thus, as depicted by output signal 46, the output potential reaches a negative voltage level, $-V_2$, which is capable of driving a connected FET switch into a nonconducting state.

It should be understood that, although the described current flow through capacitor 35 ceases as the circuit reaches an equilibrium state with command signal 20 at the positive-most level, +V, the output voltage 46 remains at its negative-most level, $-V_2$, since transistor 39 is maintained in a saturated state. The base current necessary to sustain transistor 39 in this state is provided by transistor 37 which begins to conduct, through resistor 36, as the voltage across the capacitor 35 increases. Thus, during that portion of a switching cycle which would correspond to the OFF state of a driven N channel FET, there are two distinct circuit operations, the rapid switching of transistor 39 to the conducting state, and the sustaining of transistor 39 conduction during the remainder of the time that command signal 20 remains at its positive-most level.

Referring to output signal 46, it will be recognized that the time period between $t_0$ and $t_0'$ represents the turn-off time, or that period of time required to reach the maximum negative output level, and the time interval between $t_0'$ and $t_1$ is essentially that portion of the switching cycle in which the bias current flowing through resistor 36 and transistor 37 maintains the output voltage at its maximum negative level. It has been determined that turn-off times of less than 30 nanoseconds are easily attainable with this circuit configuration.

When command signal 20 decreases to voltage $V_0$, at time $t_1$, the current flow through transistor 22 decreases, causing a decrease in the voltage drop across resistor 25 and a corresponding increase in current through transistor 23 and resistor 24. This, in turn, decreases the voltage level at circuit node A which decreases the bias current to transistor 37 so that transistor 39 enters the cut-off region, and simultaneously effects a current flow through capacitor 31. The charging of capacitor 31 through diodes 28 and 29 and resistor 32 decreases the potential at the base of transistor 33, which, in turn, causes current flow into base electrode of transistor 40 and diode-connected transistor 41 through transistor 34. As previously discussed, transistor 40 and diode-connected transistor 41 effectively double the collector current of transistor 34, thereby causing the voltage at the emitter of transistor 40 and output terminal 45 to rise toward the bias potential applied to terminal 42. As in the circuit response to the positive-going command signal, there are two distinct circuit operations. That is, capacitor 31 provides a path for rapidly switching transistor 40 into the conduction state in response to a positive transition in command signal 20, whereas diodes 28 and 29 and resistors 30 and 32 provide bias means for sustaining this circuit condition as long as command signal 20 remains at its negative-most potential.

Referring to output signal 46, the time at which the output signal reaches the positive-most signal level is denoted as time $t_1'$. It has been determined that circuits constructed in accordance with this invention are capable of driving a connected N channel JFET from a reverse gate voltage of −9 volts to a gate voltage of +0.5 volts in less than 150 nanoseconds.

FIG. 3 depicts an integrated circuit embodiment of the instant invention which utilizes silicon integrated circuit technology to achieve a monolithic circuit structure. To aid in understanding this embodiment, elements which correspond to those of FIG. 2 have been identically identified. Examining FIG. 3, it is easily understood that the circuit functions in the same manner as described for the embodiment of FIG. 2. Diode elements 28 and 29 and resistor 30 of FIG. 2 have been replaced by transistor 61, associated resistors 63, 64, and 71, and diode-connected transistors 62 and 70.

Specifically, the emitter of transistor 61 is connected to bias terminal 42, the base of transistor 61 is connected to the effective anode of diode-connected transistor 62, and the collector of transistor 61 is connected to circuit node A by resistor 64. Resistor 63 is connected between bias terminal 42 and the base of transistor 62. Resistor 71 and diode-connected transistor 70 are serially connected between the collector of transistor 61 and the capacitor 31-resistor 32 junction, whereas the second terminal of resistor 32 is connected to the effective cathode of diode-connected transistor 62.

This configuration is advantageous in that, during the ON state, the collector current of transistor 34 is substantially maintained equal to that current flowing in resistor 64 minus the small currents of resistors 71 and 63, thereby further enhancing the controlled current or high output impedance operation. Moreover, in a monolithic silicon embodiment, such as FIG. 3, this configuration is advantageous in that, during the ON state, resistor 71 provides a predetermined portion of the desired resistor 64 current, thereby restricting the resistance value of resistor 64 to a value which is readily realized as a conventional silicon integrated resistor.

The circuit of FIG. 3 also includes diode-connected transistor 65 and transistor 66. The collector of transistor 66 and the effective anode of diode-connected transistor 65 are commonly connected to bias terminal 42, the base of transistor 66 is connected to the effective cathode of diode-connected transistor 65, and the emitter of transistor 66 is commonly connected to the collector of transistor 22 and the junction of resistor 71 and diode-connected transistor 70.

In addition, during the time the driven JFET is in the OFF state, the combination of transistor 66 and diode-connected transistors 65 and 70 limit the maximum voltage which can be reached by the stray capacitance at the base of transistor 33 to essentially a single diode drop. This limits the amount of charge which must be removed during a subsequent transition to the ON state, thereby enhancing the circuit turn-on time.

The network formed by transistor 69 and resistors 67 and 68 provides increased manufacturing yields by maintaining the collector voltage of transistor 23 at a level sufficient to ensure that transistor 23 will not saturate due to bias variations which could result from normal integrated circuit manufacturing tolerances. Transistors 37, 33, 34, 61, and 62 are laterally diffused PNP transistors, thus avoiding the additional manufacturing steps necessary with conventional geometry PNP devices.

Although the discussed mode of operation has been directed to circuit embodiments for driving an N channel JFET, it will be realized by those skilled in the art that the disclosed circuit operates in a substantially identical manner when utilized to drive other type FETs, i.e., N channel depletion mode or enhancement mode IGFETs and, further, that the principles of this invention may be utilized in a circuit for driving P channel FETs. Furthermore, those skilled in the art will recognize that the disclosed circuit may be utilized in applications wherein switching devices other than FETs are employed. Thus, it is to be understood that numerous other arrangements may be devised which embody the principles of this invention.

What is claimed is:

1. A switching circuit comprising:

a first transistor, the collector of said first transistor connected to the output terminal of said switching circuit, the emitter of said first transistor connected to a first terminal of fixed potential;

a first capacitor connected between the base of said first transistor and a circuit node;

first bias means connected in parallel with said first capacitor, said first bias means responsive to the signal applied to the input terminal of said switching circuit for supplying bias to said first transistor during a first predetermined portion of said signal applied to said input terminal;

a second transistor, the emitter of said second transistor connected to said switching circuit output terminal and the collector of said second transistor connected to a second terminal of fixed potential;

a third transistor, the collector of said third transistor connected to the base of said second transistor and the emitter of said third transistor connected to said second terminal of fixed potential;

a fourth transistor, the emitter of said fourth transistor connected to the base electrode of said third transistor and the collector of said fourth transistor connected to a third terminal of fixed potential;

a second capacitor connected between the base of said fourth transistor and said circuit node;

second bias means connected between said base of said fourth transistor and said second terminal of fixed potential, said second bias means responsive to the signal applied to the input terminal of said switching circuit for supplying bias to said fourth transistor during a second predetermined portion of said signal applied to said input terminal; and circuit means connected between said switching circuit input terminal and said circuit node.

2. The switching circuit of claim 1 wherein said first bias means includes a fifth transistor, the emitter of said fifth transistor connected to said circuit node, the collector of said fifth transistor connected to the base of said first transistor, and the base of said fifth transistor connected to said third terminal of fixed potential.

3. The switching circuit of claim 2 wherein said second bias means includes first and second serially connected resistors, connected between said base of said fourth transistor and said circuit node, and first and second serially connected diodes, connected between said second terminal of fixed potential and the junction of said first and second serially connected resistors.

4. The driver circuit of claim 3 wherein said circuit means connected between said switching circuit input terminal and said circuit node includes a differential amplifier stage operated in a single-ended mode, the input terminal of said differential amplifier stage connected to said switching circuit input terminal and the output terminal of said differential amplifier connected to said circuit node.

5. The driver circuit of claim 4 wherein said first and second transistors are NPN transistors and said third, fourth, and fifth transistors are PNP transistors.

6. A high speed switching circuit comprising:

first and second capacitors, the first terminals of said first and second capacitors commonly connected to a circuit node;

a first transistor, the emitter of said first transistor connected to a first terminal of fixed potential, the collector of said first transistor connected to the output terminal of said switching circuit, and the base of said first transistor connected to the second terminal of said first capacitor;

a second transistor, the base of said second transistor connected to a second terminal of fixed potential, and the collector of said second transistor connected to said base of said first transistor;

a first resistor connected between said first terminal of said first capacitor and the emitter of said second transistor;

a second resistor connected between said base of said first transistor and said first terminal of fixed potential;

third and fourth resistors, serially connected between the first and second terminals of said second capacitor;

first and second diodes, serially connected between a third terminal of fixed potential and the junction of said serially connected third and fourth resistors;

a third transistor, the base of said third transistor connected to said second terminal of said second capacitor and the collector of said third transistor connected to said second terminal of fixed potential;

a fourth transistor, the base of said fourth transistor connected to the emitter of said third transistor and the emitter of said fourth transistor connected to said third terminal of fixed potential;

a fifth transistor, the base of said fifth transistor connected to the collector of said fourth transistor, the emitter of said fifth transistor connected to said switching circuit output terminal and the collector of said fifth transistor connected to said third terminal of fixed potential; and a third diode connected between said base and emitter of said fifth transistor.

7. The high speed switching circuit of claim 6 further including a differential amplifier stage, operated in a single-ended mode, the input terminal of said operational amplifier connected to the input terminal of said switching circuit and the output terminal of said differential amplifier connected to said circuit node.

8. An integrated switching circuit comprising:

a first transistor, the collector of said first transistor connected to a first terminal of fixed potential;

a first diode, the anode of said first diode connected to said first terminal of fixed potential and the cathode of said first diode connected to the base of said first transistor;

a second transistor, the collector of said second transistor connected to the emitter of said first transistor and the base of said second transistor connected to the input terminal of said switching circuit;

a first resistor connected between the emitter of said second transistor and a second terminal of fixed potential;

a third transistor, the emitter of said third transistor connected to said emitter of said second transistor;

a second resistor connected between the collector of said third transistor and said first terminal of fixed potential;

a fourth transistor, the collector of said fourth transistor connected to said first terminal of fixed potential and the emitter of said fourth transistor connected to said collector of said third transistor;

third, fourth, and fifth resistors, serially connected respectively between said first terminal of fixed potential and a third terminal of fixed potential, the junction of said third and fourth resistors connected to the base of said fourth transistor and the junction of said fourth and fifth resistors connected to the base of said third transistor;

a fifth transistor, the collector of said fifth transistor connected to the output terminal of said switching circuit and the emitter of said fifth transistor connected to a fourth terminal of fixed potential;

a first capacitor connected between said collector of said third transistor and the base of said fifth transistor;

a sixth transistor, the collector of said sixth transistor connected to said base of said fifth transistor and the base of said sixth transistor connected to said third terminal of fixed potential;

a sixth resistor connected between the emitter of said sixth transistor and said collector of said third transistor;

a seventh resistor connected between said base and said emitter of said fifth transistor;

a seventh transistor, the collector of said seventh transistor connected to said first terminal of fixed potential and the emitter of said seventh transistor connected to said switching circuit output terminal;

an eighth transistor, the collector of said eighth transistor connected to the base of said seventh transistor;

a ninth transistor, the collector of said ninth transistor connected to said base of said seventh transistor, the emitter of said ninth transistor connected to said first terminal of fixed potential, and the base of said ninth transistor connected to the collector of said eighth transistor;

an eighth resistor connected between said first terminal of fixed potential and said emitter of said eighth transistor;

a second capacitor connected between the base of said eighth transistor and said collector of said third transistor;

a second diode connected between said base and said emitter of said seventh transistor;

a tenth transistor, the emitter of said tenth transistor connected to said first terminal of fixed potential;

a ninth resistor connected between said first terminal of fixed potential and the base of said tenth transistor;

a third diode connected between the base and collector of said tenth transistor;

a tenth resistor connected between said collector of said third transistor and said collector of said tenth transistor;

an eleventh resistor connected between said collector of said tenth transistor and said emitter of said first transistor;

a twelfth resistor connected between said base of said eighth transistor and the cathode of said third diode; and a fourth diode connected between said emitter of said first transistor and said base of said eighth transistor.

9. The switching circuit of claim 8 wherein said sixth, eighth, ninth, and tenth transistors are laterally diffused PNP transistors and said first, second, third, fourth, fifth, and seventh transistors are NPN transistors.

10. The switching circuit of claim 8 wherein said first, second, third, and fourth diodes are diode-connected transistors.

* * * * *